(12) United States Patent
Lee et al.

(10) Patent No.: US 10,192,782 B2
(45) Date of Patent: Jan. 29, 2019

(54) METHOD OF MANUFACTURING SEMICONDUCTOR DEVICE USING A PLURALITY OF ETCH STOP LAYERS

(71) Applicants: Woojin Lee, Hwaseong-si (KR); VietHa Nguyen, Yongin-si (KR); Wookyung You, Incheon (KR); Doo-Sung Yun, Yongin-si (KR); Hyunbae Lee, Seoul (KR); Byunghee Kim, Seoul (KR); Sang Hoon Ahn, Goyang-si (KR); Seungyong Yoo, Incheon (KR); Naein Lee, Seoul (KR); Hoyun Jeon, Hwaseong-si (KR)

(72) Inventors: Woojin Lee, Hwaseong-si (KR); VietHa Nguyen, Yongin-si (KR); Wookyung You, Incheon (KR); Doo-Sung Yun, Yongin-si (KR); Hyunbae Lee, Seoul (KR); Byunghee Kim, Seoul (KR); Sang Hoon Ahn, Goyang-si (KR); Seungyong Yoo, Incheon (KR); Naein Lee, Seoul (KR); Hoyun Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 61 days.

(21) Appl. No.: 14/747,316

(22) Filed: Jun. 23, 2015

(65) Prior Publication Data
US 2016/0133512 A1     May 12, 2016

(30) Foreign Application Priority Data
Nov. 12, 2014  (KR) ........................ 10-2014-0157414

(51) Int. Cl.
  *H01L 21/768*  (2006.01)
  *H01L 21/31*   (2006.01)
  (Continued)

(52) U.S. Cl.
  CPC .. *H01L 21/76832* (2013.01); *H01L 21/31111* (2013.01); *H01L 21/31144* (2013.01);
  (Continued)

(58) Field of Classification Search
  None
  See application file for complete search history.

(56) References Cited

U.S. PATENT DOCUMENTS 6,455,417 B1 *  9/2002  Bao ................... H01L 21/02126
                                              257/E21.277
6,730,594 B2    5/2004  Noguchi et al.
                (Continued)

FOREIGN PATENT DOCUMENTS

JP   2009182000 A    8/2009
JP   2010287653 A   12/2010

*Primary Examiner* — Khaja Ahmad
(74) *Attorney, Agent, or Firm* — Harness, Dickey & Pierce, P.L.C.

(57) ABSTRACT

A method of manufacturing the semiconductor device includes providing a first interlayer dielectric layer having a conductive pattern, sequentially forming a first etch stop layer, a second etch stop layer, a second interlayer dielectric layer and a mask pattern on the first interlayer dielectric layer, forming an opening in the second interlayer dielectric layer using the mask pattern as a mask, the opening exposing the second etch stop layer, and performing an etching process including simultaneously removing the mask pattern and the second etch stop layer exposed by the opening to expose the first etch stop layer.

20 Claims, 12 Drawing Sheets

(51) Int. Cl.
*H01L 21/311* (2006.01)
*H01L 21/321* (2006.01)
*H01L 21/3213* (2006.01)

(52) U.S. Cl.
CPC .. *H01L 21/32134* (2013.01); *H01L 21/76807* (2013.01); *H01L 21/76834* (2013.01)

(56) References Cited

U.S. PATENT DOCUMENTS

| | | | |
|---|---|---|---|
| 6,815,824 B2 | 11/2004 | Shioya et al. | |
| 7,084,056 B2 | 8/2006 | Won | |
| 7,176,571 B2 | 2/2007 | Cheng et al. | |
| 7,180,191 B2 | 2/2007 | Sasaki et al. | |
| 7,459,388 B2 | 12/2008 | Kim et al. | |
| 7,531,901 B2 | 5/2009 | Lee | |
| 7,550,822 B2 | 6/2009 | Lee et al. | |
| 7,968,506 B2 | 6/2011 | Chou et al. | |
| 8,378,488 B2 | 2/2013 | Arai | |
| 8,664,115 B2 | 3/2014 | Bartsch et al. | |
| 2002/0076918 A1* | 6/2002 | Han | H01L 21/76807 438/634 |
| 2003/0219973 A1* | 11/2003 | Townsend | H01L 21/0271 438/631 |
| 2004/0147100 A1* | 7/2004 | Jang | H01L 21/0214 438/584 |
| 2005/0153537 A1* | 7/2005 | Cheng | H01L 21/76807 438/627 |
| 2008/0105980 A1* | 5/2008 | Kim | H01L 21/76808 257/758 |
| 2009/0289367 A1 | 11/2009 | Kodama et al. | |
| 2010/0178771 A1* | 7/2010 | Oh | H01L 21/31144 438/700 |
| 2013/0052818 A1* | 2/2013 | Shih | H01L 21/76811 438/653 |
| 2013/0069234 A1* | 3/2013 | Lee | H01L 23/53238 257/751 |
| 2014/0091468 A1 | 4/2014 | Noguchi et al. | |
| 2015/0048488 A1* | 2/2015 | Peng | H01L 23/53295 257/637 |

* cited by examiner

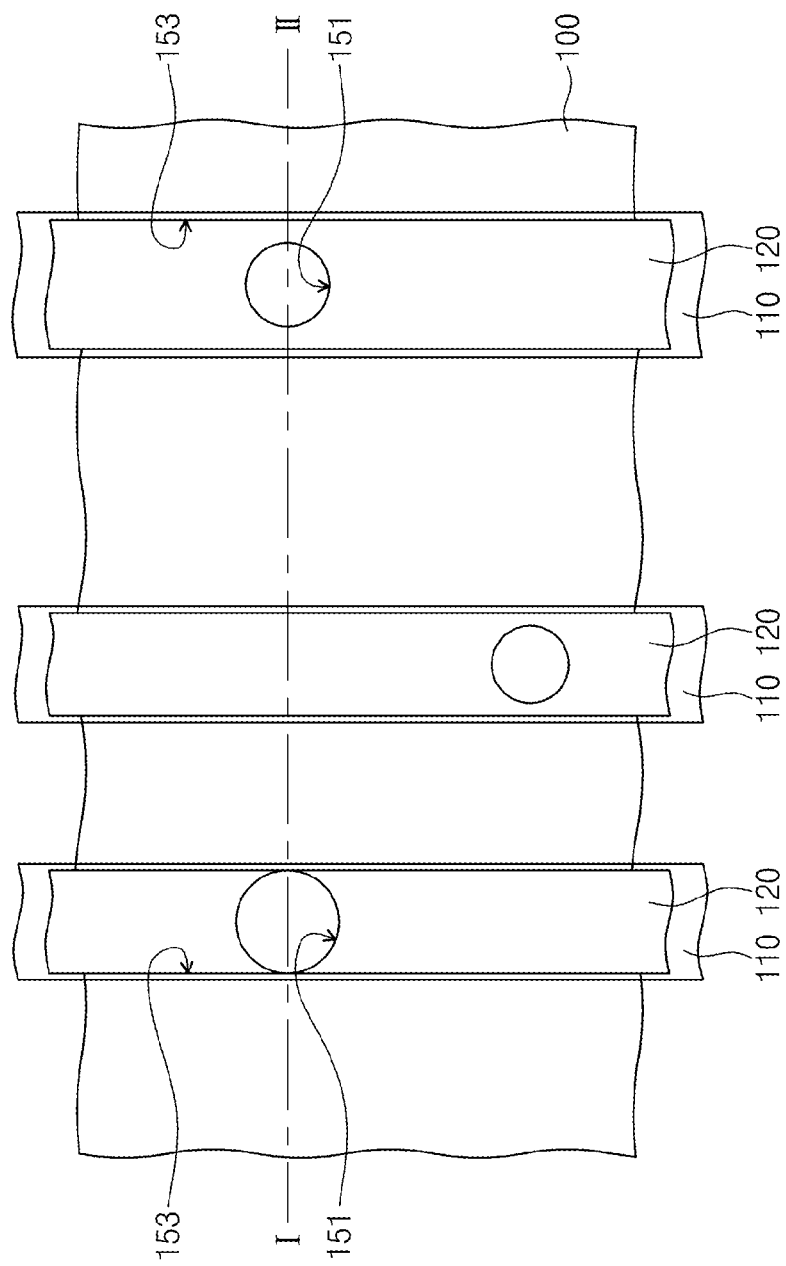

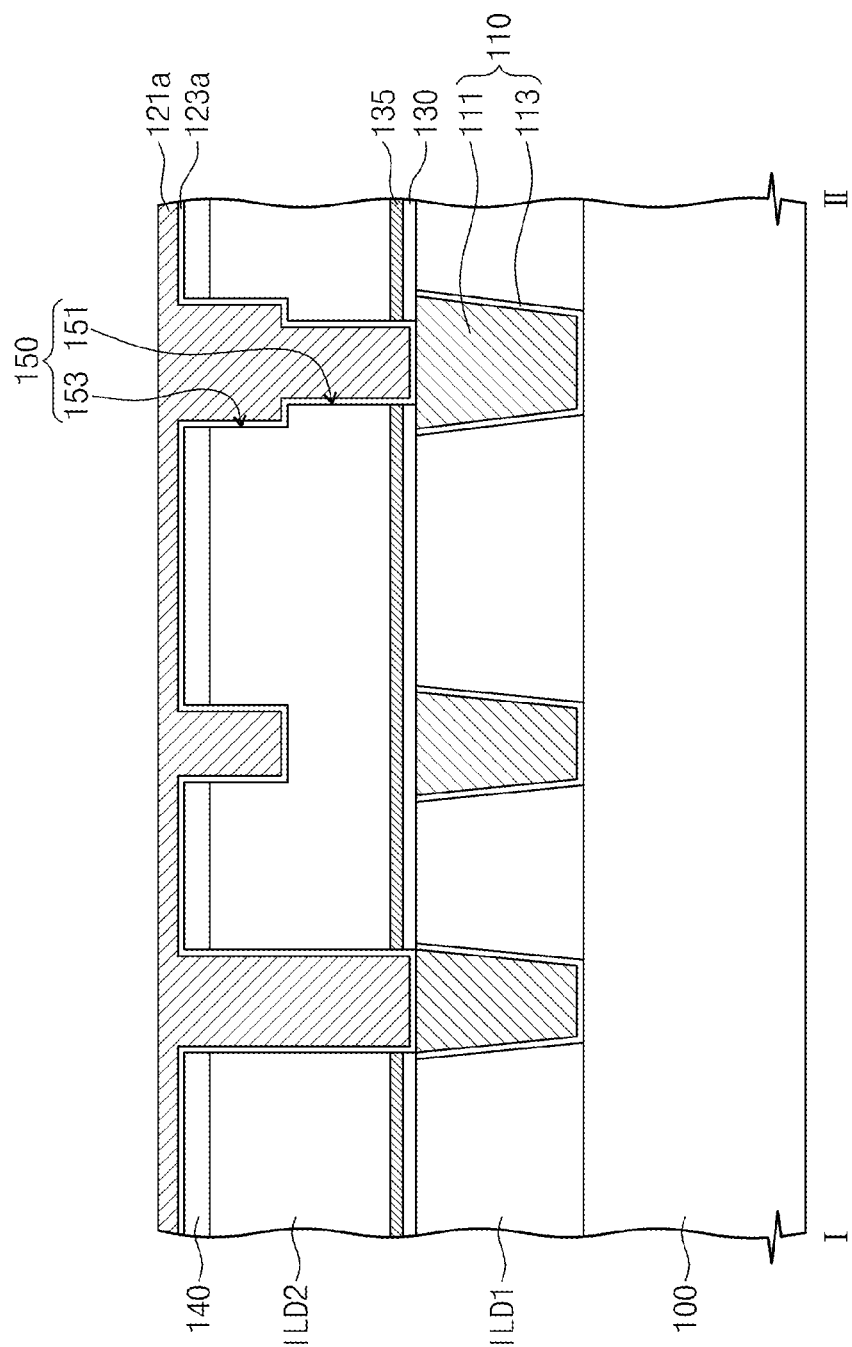

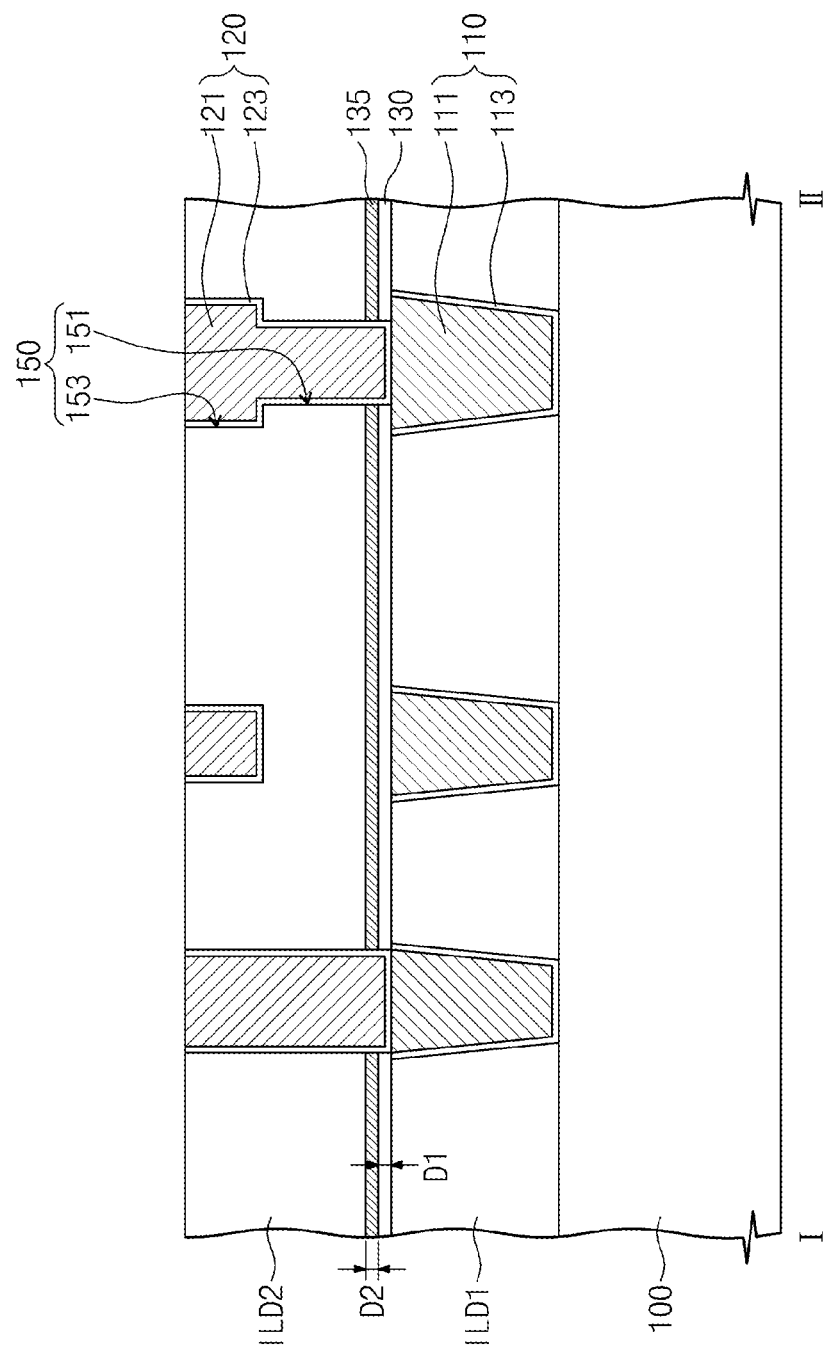

METHOD OF MANUFACTURING SEMICONDUCTOR DEVICE USING A PLURALITY OF ETCH STOP LAYERS

CROSS-REFERENCE TO RELATED APPLICATION

This U.S. non-provisional patent application claims priority under 35 U.S.C. § 119 to Korean Patent Application No. 10-2014-0157414 filed on Nov. 12, 2014 in the Korean Intellectual Property Office (KIPO), the contents of which are herein incorporated by reference in their entirety.

BACKGROUND

1. Field

Example embodiments of the present inventive concepts relate to a method of manufacturing a semiconductor device using a plurality of etch stop layers.

2. Discussion of Related Art

Nowadays, semiconductor devices are required to be highly integrated and to be highly densified. The semiconductor devices may include a lower conductive pattern, an interlayer dielectric layer formed on the lower conductive pattern, and an upper conductive pattern formed in the interlayer dielectric layer. The upper conductive pattern may be electrically connected to the lower conductive pattern through an opening formed in the interlayer dielectric layer.

When forming the opening in the interlayer dielectric layer to expose an upper surface of the lower conductive pattern using an etch process, the upper surface of the lower conductive pattern may be damaged by the etch process. Additionally, the upper surface of the lower conductive pattern may be oxidized by a chemical reaction with hydroxide or oxygen contained in the interlayer dielectric layer.

Recently, an etch stop layer has been formed between the lower conductive pattern and the upper conductive pattern to reduce the etch damage or the oxidized phenomenon of the upper surface of the lower conductive pattern.

SUMMARY

Example embodiments of the present inventive concepts provide a method of manufacturing a semiconductor device using a plurality of etch stop layers.

According to example embodiments of the present inventive concepts, a method of manufacturing the semiconductor device includes providing a first interlayer dielectric layer having a conductive pattern, sequentially forming a first etch stop layer, a second etch stop layer, a second interlayer dielectric layer and a mask pattern on the first interlayer dielectric layer, forming an opening in the second interlayer dielectric layer using the mask pattern as a mask, the opening exposing the second etch stop layer, and performing an etching process including simultaneously removing the mask pattern and the second etch stop layer exposed by the opening to expose the first etch stop layer.

The conductive pattern may not be exposed during the performing of the etching process.

The method may further include exposing the conductive pattern by removing the first etch stop layer exposed by the opening, forming a conductive layer in the opening and on the second interlayer dielectric layer, and planarizing the conductive layer to expose an upper surface of the second interlayer dielectric layer.

The mask pattern may be removed before forming the conductive layer.

The method may further include forming a barrier metal layer on a bottom surface and on a sidewall of the opening before forming the conductive layer.

A portion of the first etch stop layer and a portion of the second etch stop layer may remain between the conductive pattern and the second interlayer dielectric layer after exposing the conductive pattern.

The first etch stop layer may include silicon (Si) and carbon (C).

The second etch stop layer may include an insulating layer containing aluminum (Al).

The mask pattern may include at least one of titanium oxide, titanium nitride, tungsten, and any combination thereof.

The method may further include forming a capping layer between the second interlayer dielectric layer and the mask pattern.

According to example embodiments of the inventive concepts, a method of manufacturing the semiconductor device includes providing a first interlayer dielectric layer having a first conductive pattern, forming a first etch stop layer on the first conductive pattern and on the first interlayer dielectric layer, forming a second etch stop layer on the first etch stop layer, forming a second interlayer dielectric layer on the second etch stop layer, forming a mask pattern on the second interlayer dielectric layer, forming an opening in the second interlayer dielectric layer to expose the second etch stop layer by etching the second interlayer dielectric layer not covered with the mask pattern, and removing the mask pattern to expose an upper surface of the second interlayer dielectric layer and not expose the first conductive pattern.

The removal of the mask pattern may include etching the second etch stop layer to expose the first etch stop layer.

The first etch stop layer may have an etch selectivity with respect to the second etch stop layer during the etching of the second etch stop layer.

The method may further include exposing the first conductive pattern by removing the first etch stop layer exposed by the opening, forming a conductive layer in the opening and on the second interlayer dielectric layer, and planarizing the conductive layer to form a second conductive pattern in the opening.

The first etch stop layer may include at least one of silicon carbide, silicon nitride, silicon carbon nitride, silicon boron carbide, silicon boron carbon nitride, and any combination thereof. The second etch stop layer may include an insulating layer containing aluminum.

A sum of the thicknesses of the first and second etch stop layers may be about 20 angstroms to about 100 angstroms.

The second interlayer dielectric layer may have a dielectric constant less than that of the first etch stop layer and the second etch stop layer.

Forming the opening may include forming a via hole in a lower portion of the second interlayer dielectric layer to expose the second etch stop layer, and forming a trench in an upper portion of the second interlayer dielectric layer, the trench connected to the via hole.

The first conductive pattern may include a metal pattern including one of tungsten and copper, and a barrier metal pattern on a sidewall and a bottom surface of the metal pattern.

According to example embodiments of the inventive concepts, a method of manufacturing the semiconductor device includes forming a first interlayer dielectric layer on a substrate, the first interlayer dielectric layer having a first conductive pattern, forming a first etch stop layer on the first conductive pattern and on the first interlayer dielectric layer, forming a second etch stop layer on the first etch stop layer, forming a second interlayer dielectric layer on the second etch stop layer, forming a mask pattern on the second interlayer dielectric layer, forming an opening in the second interlayer dielectric layer to expose the second etch stop layer by etching the second interlayer dielectric layer not covered with the mask pattern, removing the second etch stop layer exposed by the opening and the mask pattern simultaneously to expose an upper surface of the first etch stop layer and an upper surface of the second interlayer dielectric layer, respectively, removing the first etch stop layer to expose the first conductive pattern, and forming a second conductive pattern in the opening.

According to example embodiments of the inventive concepts, a method of manufacturing a semiconductor device includes providing a first interlayer dielectric layer having a conductive pattern, forming a first etch stop layer and a second etch stop layer covering the conductive pattern, forming a second interlayer dielectric layer and a mask pattern on the second etch stop layer, etching the second interlayer dielectric layer using the mask pattern to form an opening exposing the second etch stop layer, and simultaneously removing the mask pattern and the second etch stop layer exposed by the opening, the mask pattern and the second etch stop layer including a material having an etch selectivity with respect to the first etch stop layer.

The method further includes exposing the conductive pattern by removing the first etch stop layer exposed by the opening, forming a conductive layer in the opening and on the second interlayer dielectric layer, and planarizing the conductive layer to expose an upper surface of the second interlayer dielectric layer.

The mask pattern may be removed before forming the conductive layer.

A sum of the thicknesses of the first and second etch stop layers may be about 20 angstroms to about 100 angstroms.

BRIEF DESCRIPTION OF THE DRAWINGS

The foregoing and other features and advantages of this disclosure will be apparent from the more particular description of the example embodiments, as illustrated in the accompanying drawings in which like reference characters refer to the same parts throughout the different views. The drawings are not necessarily to scale, emphasis instead being placed upon illustrating the principles of the disclosed embodiments.

FIG. 1 is a plan view illustrating a semiconductor device according to example embodiments of the inventive concepts.

FIGS. 2a through 2e, and 2g are cross-sectional views illustrating a method of manufacturing a semiconductor device according to example embodiments of the inventive concepts.

DETAILED DESCRIPTION

Figure 2A:
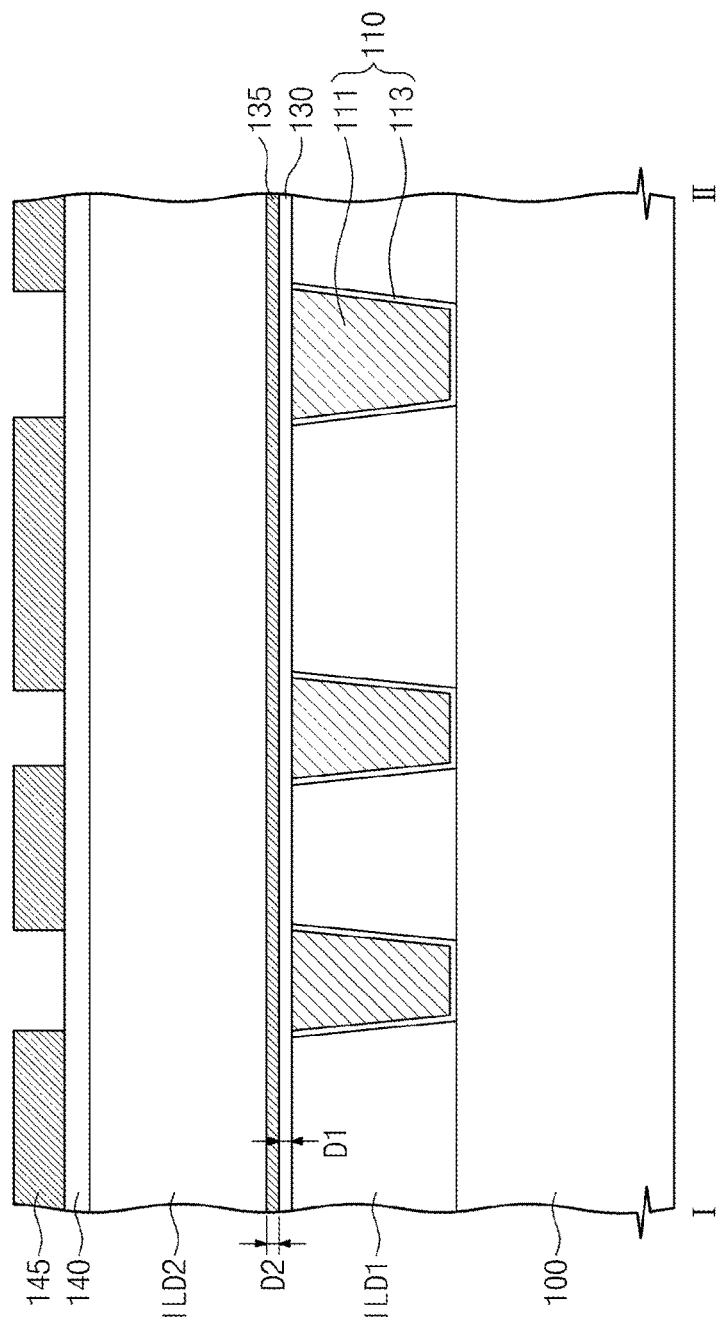

Example embodiments of the inventive concepts will now be described more fully hereinafter with reference to the accompanying drawings; however, they may be embodied in different forms and should not be construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the figures, the dimensions of layers and regions may be exaggerated for clarity of illustration.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

FIG. 1 is a plan view illustrating a semiconductor device according to example embodiments of the inventive concepts. FIGS. 2a through 2e, and 2g are cross-sectional views illustrating a method of manufacturing a semiconductor device according to example embodiments of the inventive concepts. FIGS. 2a through 2e, and 2g are cross-sectional views corresponding to line I-II of FIG. 1.

Referring to FIGS. 1 and 2a, a first interlayer dielectric layer ILD1, a first etch stop layer 130, a second etch stop layer 135, a second interlayer dielectric layer ILD2, and a mask pattern 145 may be formed on a substrate 100. The substrate 100 may be a semiconductor substrate, e.g., a silicon (Si) substrate, a germanium (Ge) substrate, or a silicon germanium (SiGe) substrate. The substrate 100 may include a plurality of integrated circuits having transistors and/or memory cells.

The first interlayer dielectric layer ILD1 may be formed using at least one process of HDP (High Density Plasma), TEOS (Tetra Ethyl Ortho Silicate), PE-TEOS (Plasma Enhanced Tetra Ethyl Ortho Silicate), O3-TEOS (Ozone Tetra Ethyl Ortho Silicate), USG (Undoped Silica Glass), PSG (Phospho-Silacate Glass), BSG (Boro-Silicate Glass), BPSG (Boro-Phospho-Silicate Glass), FSG (Fluoride Silicate Glass), SOG (Spin On Glass), TOSZ (Tonen SilaZene), and any combination thereof, however, it shall not be restricted or limited thereto.

A first conductive pattern 110 may be formed in the first interlayer dielectric layer ILD1. The first conductive pattern 110 may include a first metal pattern 111 and a first barrier metal pattern 113. For example, the first metal pattern 111 may include tungsten and/or copper. The first barrier metal pattern may be formed on a bottom surface and a sidewall of the first metal pattern 111. The first barrier metal pattern 113 may not cover an upper surface of the first metal pattern 111. The first barrier metal pattern 113 may include at least one of titanium, titanium nitride, tungsten nitride, and any combination thereof. The first conductive pattern 110 may be electrically connected to a transistor or a memory cell formed on the substrate 100.

The first etch stop layer 130 may be formed on the first interlayer dielectric layer ILD1 and on the first conductive pattern 110. The first etch stop layer 130 may have an etch selectivity with respect to the first conductive pattern 110. The first etch stop layer 130 may include silicon (Si) and carbon (C), however, the first etch stop layer 130 may not include oxygen. For example, the first etch stop layer 130 may include at least one of silicon carbide, silicon nitride, silicon carbon nitride, silicon boron carbide, silicon boron carbon nitride, and any combination thereof.

The second etch stop layer 135 may be formed on the first etch stop layer 130. The second etch stop layer 135 may include metal. The second etch stop layer 135 may include aluminum, e.g., aluminum nitride or aluminum carbon nitride. A sum of the thicknesses of the first etch stop layer 130 and the second etch stop layer 135 may be about 20 angstroms to about 100 angstroms.

The second interlayer dielectric layer ILD2 may be formed on the second etch stop layer 135. The second interlayer dielectric layer ILD2 may have a dielectric constant less than those of the first and second etch stop layers 130 and 135. The second interlayer dielectric layer ILD2 may be formed of substantially the same material as the first interlayer dielectric layer ILD1.

A capping layer 140 may be formed on the second interlayer dielectric layer ILD2. The capping layer 140 may include silicon oxide, silicon nitride, silicon oxynitride, and any combination thereof. The capping layer 140 may have a dielectric constant greater than that of the second interlayer dielectric layer ILD2. In example embodiments, the capping layer 140 may be omitted.

The mask pattern 145 may be formed on the capping layer 140. Some portion of the capping layer 140 may be not covered by the mask pattern 145. The mask pattern 145 may include metal. For example, the mask pattern 145 may include at least one of titanium oxide, titanium nitride, tungsten, and any combination thereof. In example embodiments, if the capping layer 140 is omitted, the mask pattern may expose some portion of the second interlayer dielectric layer ILD2.

Figure 2B:
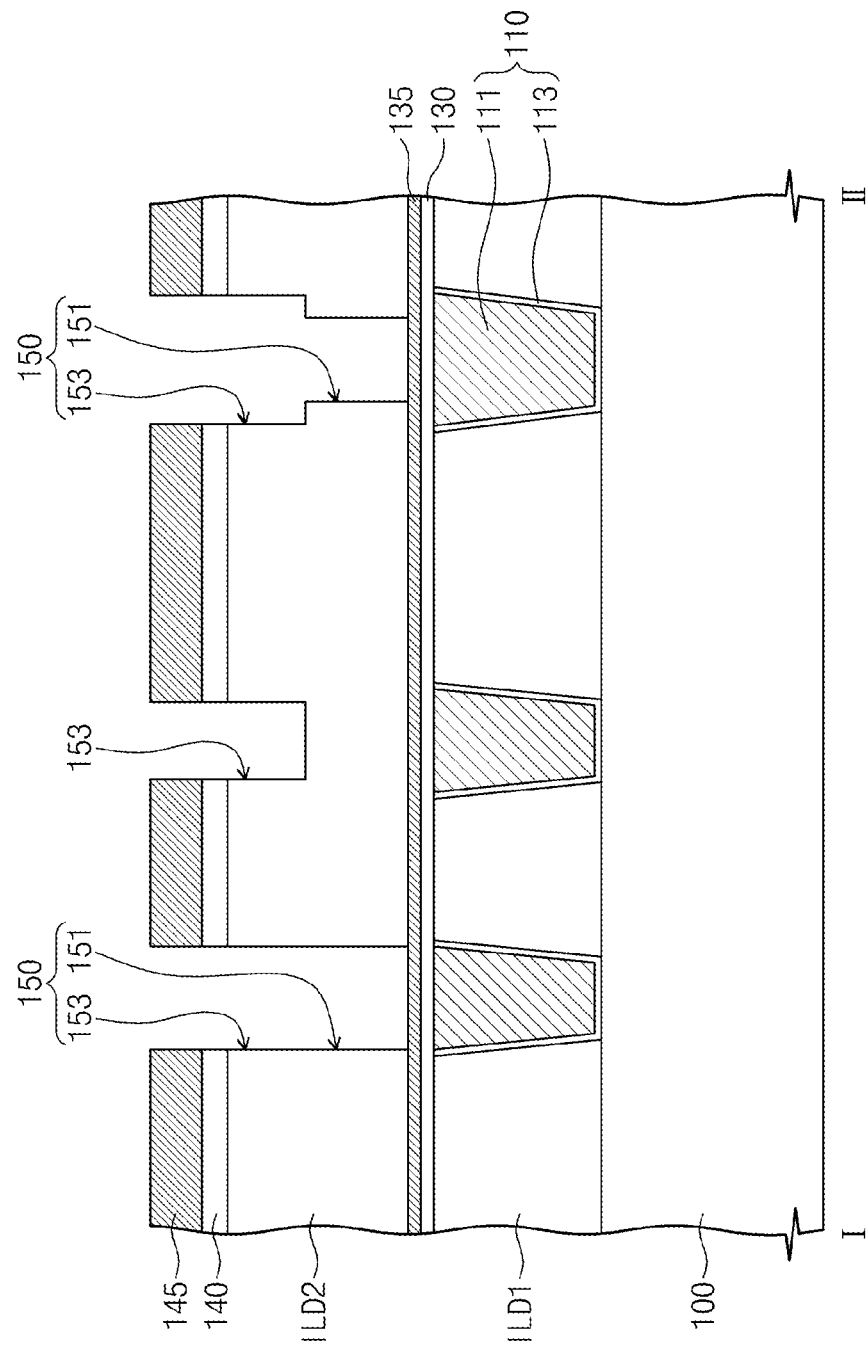

Referring to FIGS. 1 and 2b, an opening 150 may be formed in the second interlayer dielectric layer ILD2. The opening 150 may pass through the capping layer 140 and the second interlayer dielectric layer ILD2 to expose an upper surface of the second etch stop layer 135. The opening 150 may be formed by etching the capping layer 140 and the second interlayer dielectric layer ILD2 using the mask pattern 145 as a mask. The second etch stop layer 135 may have an etch selectivity with respect to the second interlayer dielectric layer ILD2. For example, the second etch stop layer 135 may have an etch rate less than that of the second interlayer dielectric layer ILD2 during the formation of the opening 150. Therefore, the second etch stop layer 135 may remain at a bottom of the opening 150.

The opening 150 may include a via hole 151 and a trench 153. The via hole 151 may be formed at a lower portion of the second interlayer dielectric layer ILD2. The trench 153 that is physically connected to the via hole 151 may be formed at an upper portion of the second interlayer dielectric layer ILD2. The opening 150 may be formed using a trench first dual damascene process. The trench 153 may have a width greater than that of the via hole 151. Both sidewalls of the trench 153 may be vertically aligned with both sidewalls of the mask pattern 145. The via hole 151 may be formed in the trench 153 and to expose an upper surface of the second etch stop layer 135 using an additional mask (not shown in FIG. 2b). However, it shall not be restricted or limited thereto.

Figure 2C:
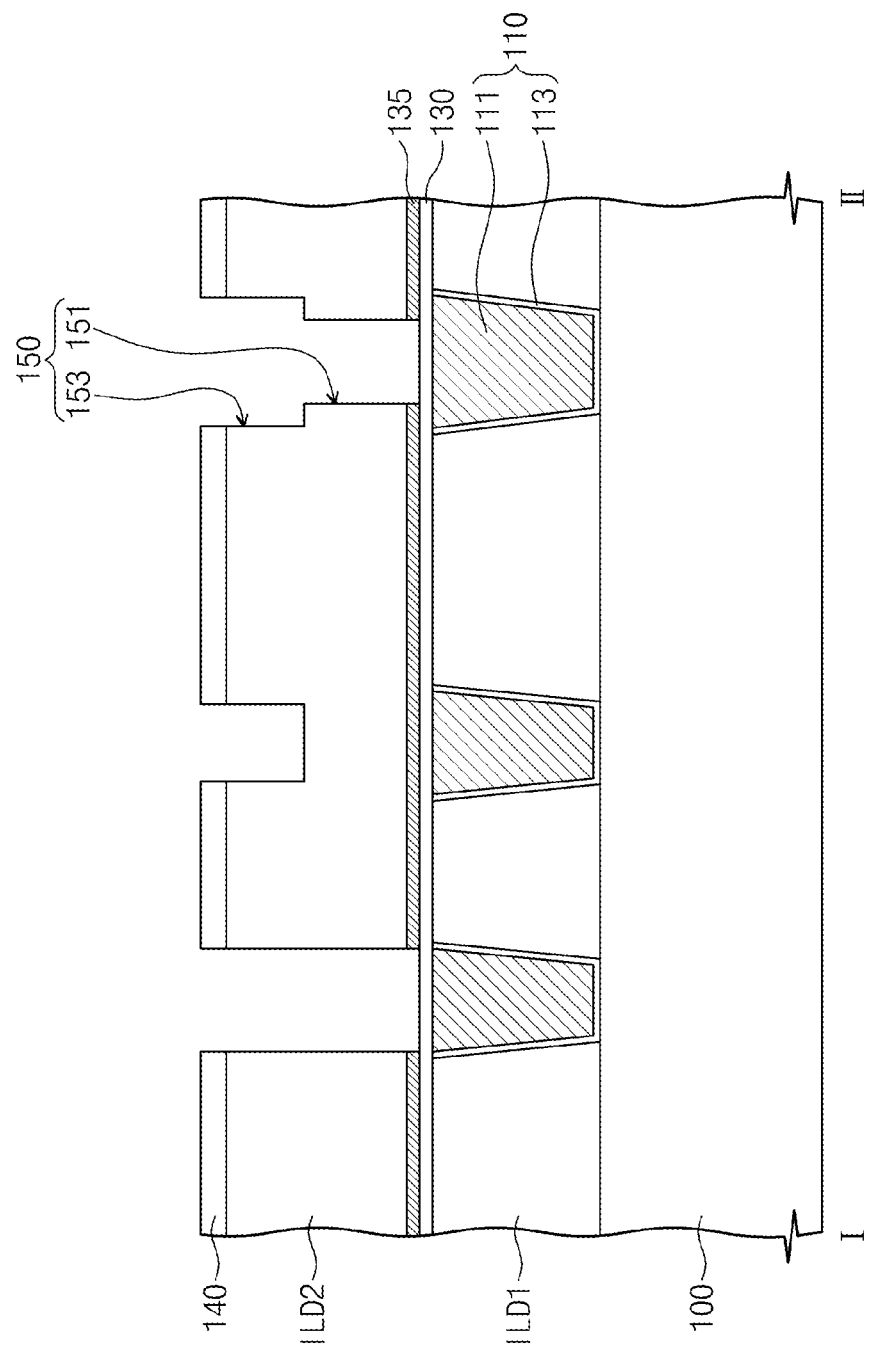

Referring to FIGS. 1 and 2c, the mask pattern 145 and the second etch stop layer 135 exposed by the opening 150 may be simultaneously removed using an etching process. The etching process may be performed using a chemical solution including hydrogen peroxide and/or tetramethyl ammonium hydroxide (TMAH). The etching process may also be performed using a chemical solution including hydrogen peroxide and/or ammonium fluoride ($NH_4F$). Upper surfaces of the capping layer 140 and the first etch stop layer 130 may be exposed after performing the etching process. During the etching process, the etch rate of the mask pattern 145 may be greater than those of the capping layer 140 and the second interlayer dielectric layer ILD2.

In example embodiments, if the capping layer 140 is omitted, upper surfaces of the second interlayer dielectric layer ILD2 and the first etch stop layer 130 may be exposed after performing the etching process. During the etching process, the etch rate of the second etch stop layer 135 may be greater than that of the first etch stop layer 130. Therefore, the first etch stop layer 130 may remain after performing the etching process.

A portion of the second etch stop layer 135 may remain between the first conductive pattern 110 and the second interlayer dielectric layer ILD2 after the removal of the mask pattern 145. A portion of the second etch stop layer 135 may be also remained between the first interlayer dielectric layer ILD1 and the second interlayer dielectric layer ILD2 after the removal of the mask pattern 145.

The first etch stop layer 130 may protect the first conductive pattern 110 from being damaged during the etching process. Therefore, the reliability of the semiconductor device according to example embodiments of the inventive concepts may be increased.

Figure 2D:
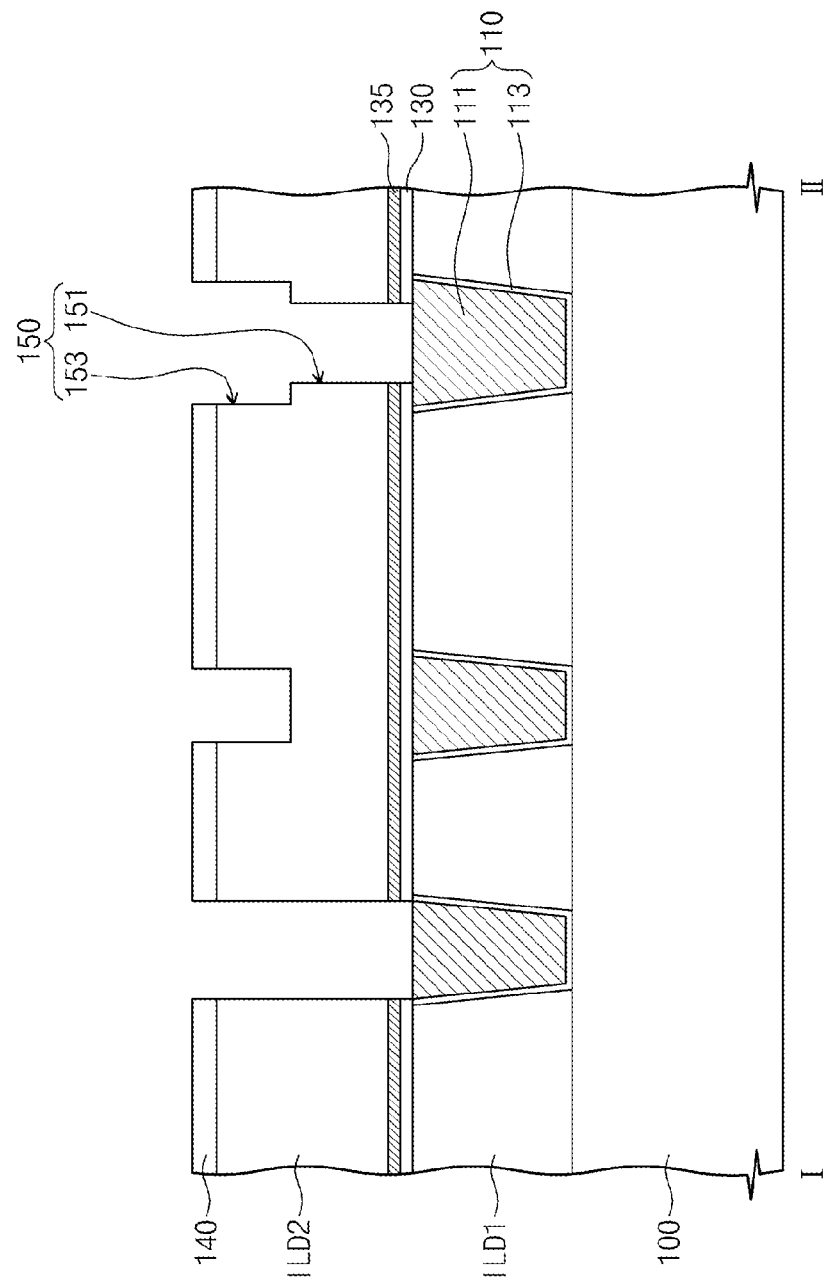

Referring to FIGS. 1 and 2d, the first etch stop layer 130 exposed by the opening 150 may be removed to expose an upper surface of the first conductive pattern 110. At this moment, a portion of the first etch stop layer 130 may remain between the first conductive pattern 110 and the second interlayer dielectric layer ILD2. A portion of the second etch stop layer 135 may be also remained between the first interlayer dielectric layer ILD1 and the second interlayer dielectric layer ILD2 after exposing the upper surface of the first conductive pattern 110.

Referring to FIGS. 1 and 2e, a barrier layer 123a may be formed on a sidewall and on a bottom of the opening 150. The barrier layer 123a may be also conformally formed on the upper surface of the first conductive pattern 110 exposed by the opening 150 and on the upper surface of the capping layer 140. In example embodiments, if the capping layer 140 is omitted, the barrier layer 123a may be conformally formed on the upper surface of the second interlayer dielectric layer ILD2. The barrier layer 123a may include at least one of titanium, titanium nitride, tungsten nitride, and any combination thereof.

A conductive layer 121a may be formed in the opening 150 and on the barrier layer 123a. The conductive layer 121a may be formed by an electroplating process using copper and/or tungsten.

According to example embodiments of the inventive concepts, an aspect ratio of the opening 150 may be decreased by removing the mask pattern 145 before the formation of the conductive layer 121a. Therefore, the conductive layer 121a may fill the opening 150 without voids or seams.

Figure 2F:
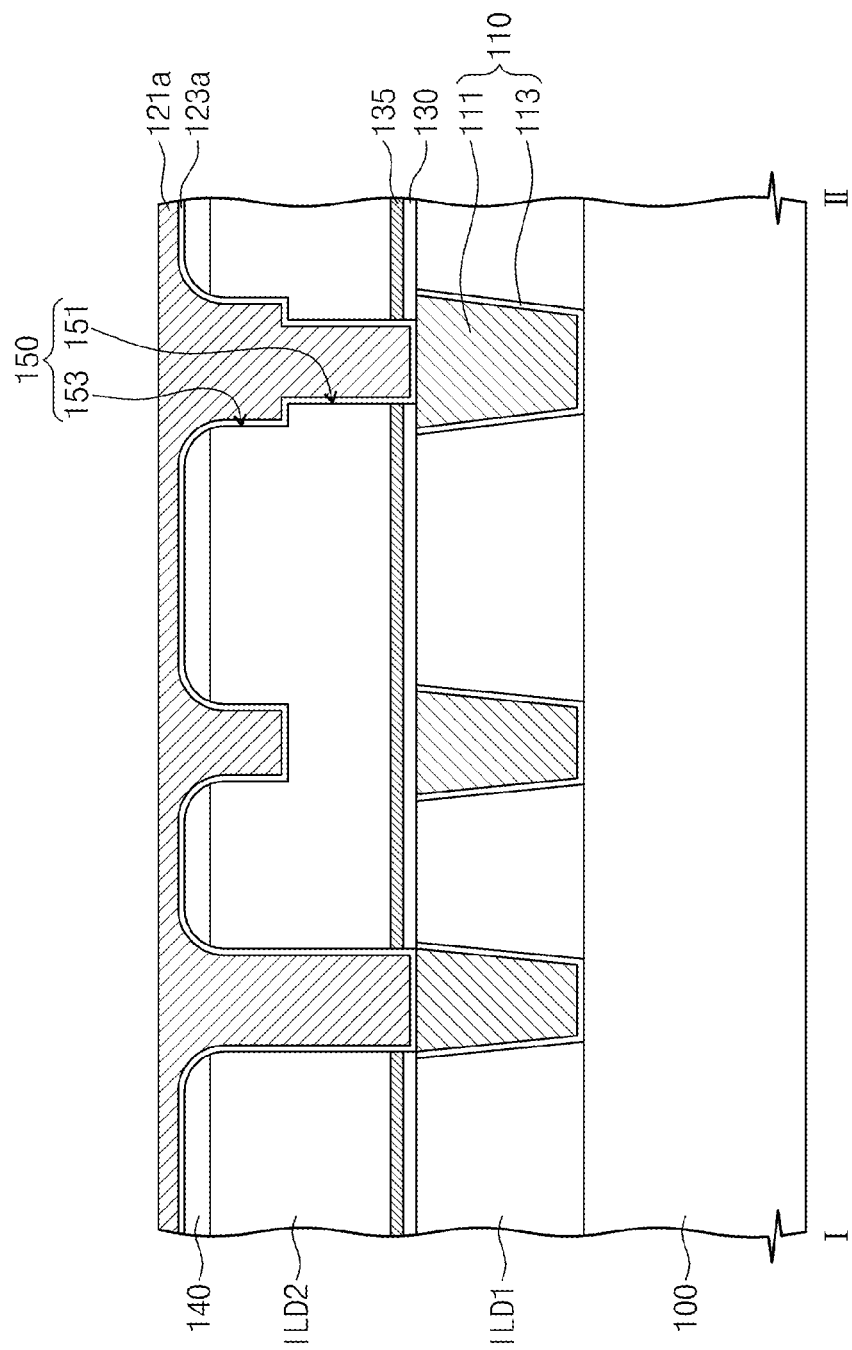
FIG. 2f is a cross-sectional view illustrating a method of manufacturing a semiconductor device according to example embodiments of the inventive concepts.

FIG. 2f is a cross-sectional view illustrating a method of manufacturing a semiconductor device according to example embodiments of the inventive concepts.

For convenience of explanation, some of descriptions which are substantially the same as descriptions mentioned above referring to FIGS. 2a through 2e will be omitted.

Referring to FIGS. 2f and 2d, a portion of the capping layer 140 which is adjacent the upper portion of the opening 150 may be removed during the formation of the opening 150 and the upper portion of the opening 150 may have a rounded shape as shown in FIG. 2f. Therefore, an upper width of the trench 153 may be greater than a bottom width of the trench 153.

A barrier layer 123a may be formed on a sidewall and on a bottom of the opening 150. The barrier layer 123a may be also conformally formed on the upper surface of the first conductive pattern 110 exposed by the opening 150 and on the upper surface of the capping layer 140. In example embodiments, if the capping layer 140 is omitted, the barrier layer 123a may be conformally formed on the upper surface of the second interlayer dielectric layer ILD2.

A conductive layer 121a may be formed in the opening 150 and on the barrier layer 123a. The conductive layer 121a may be formed by an electroplating process using copper and/or tungsten. The wider width of the trench 153 at the upper portion thereof may be more helpful to fill the opening 150 by the conductive layer 121a without any voids or seams.

Referring to FIGS. 1 and 2g, the conductive layer 121a and the barrier layer 123a may be planarized by a planarization process, e.g., a chemical mechanical polishing process, to form a second conductive pattern 120. During the planarization process, the capping layer 140 may be removed and an upper surface of the second interlayer dielectric layer ILD2 may be exposed. The second conductive pattern 120 may be formed in the opening 150.

A lower portion of the second conductive pattern 120 formed in the via hole 151 may act as an interconnection. And, an upper portion of the second conductive pattern 120 which is formed in the trench 153 may act as a wiring. The second conductive pattern 120 may include a second metal pattern 121 and a second barrier metal pattern 123. The second barrier metal pattern 123 may include at least one of titanium, titanium nitride, tungsten nitride, and any combination thereof. The second metal pattern 121 may include tungsten and/or copper. For example, the first metal pattern 111 may comprise tungsten and the second metal pattern 121 may comprise copper.

The first and second interlayer dielectric layers ILD1 and ILD2 may include hydroxide and/or oxygen. The sidewall and bottom surfaces of the first metal pattern 111 may be protected by the first barrier metal pattern 113. If the first etch stop layer 130 and the second etch stop layer 135 are omitted, a bottom portion of the second interlayer dielectric layer ILD2 may directly contact with an upper surface of the first metal pattern 111. Therefore, an upper surface of the first metal pattern 111 may be oxidized by a chemical reaction between the metal material of the first metal pattern 111 and the hydroxide (and/or oxygen) of the second interlayer dielectric layer ILD2.

According to example embodiments of the inventive concepts, a portion of the first etch stop layer 130 and a portion of the second etch stop layer 135 may remain between the first conductive pattern 110 and the second interlayer dielectric layer ILD2. Therefore, the first conductive pattern 110 may not directly contact with the second interlayer dielectric layer ILD2. That is, the first etch stop layer 130 and the second etch stop layer 135 may prevent or inhibit the first conductive pattern 110 from being oxidized. At this moment, the first etch stop layer 130, which is directly connected with the upper surface of the first conductive pattern 110, may not include any oxygen.

If the second etch stop layer 135 is omitted, the first etch stop layer 130 may be formed more thickly. For example, the first etch stop layer 130 may have a thickness greater than about 150 angstroms. If the thickness of the first etch stop layer 130 is less than 125 angstroms, the first etch stop layer 130 may not prevent or inhibit the first metal pattern 111 from being oxidized by a chemical reaction with the hydroxide (and/or oxygen) contained in the second interlayer dielectric layer ILD2. Furthermore, if the thickness of the first etch stop layer 130 is less than 125 angstroms, the first etch stop layer 130 may not protect the first metal pattern 111 from being damaged by an etching process which is performed for removing the mask pattern 145 and the second etch stop layer 135 (see FIG. 2c).

On the contrary, if the second etch stop layer 135 is formed on the first etch stop layer 130, a sum of the thicknesses D1 and D2 of the first and second etch stop layers 130 and 135 may decrease when compared with a single first etch stop layer 130, i.e., where the second etch stop layer 135 is omitted. For example, the sum of the thicknesses D1 and D2 of the first and second etch stop layers 130 and 135 may have a range of about 20 angstroms to about 100 angstroms. The reason the sum of the thicknesses D1 and D2 may decrease is that the second etch stop layer 135 having a relatively high etch selectivity with respect to the second interlayer dielectric layer ILD2 may protect the first etch stop layer 130 even though the thickness D2 of the second etch stop layer 135 is relatively thin, and the first etch stop layer 130 having a relatively high etch selectivity with respect to the mask pattern 145 may protect the first conductive pattern 110 during the removal of the mask pattern 145 even though the thickness D1 of the first etch stop layer 130 is relatively thin. The first etch stop layer 130 or the second etch stop layer 135 may have a dielectric constant greater than that of the second interlayer dielectric layer ILD2.

Figure 3:
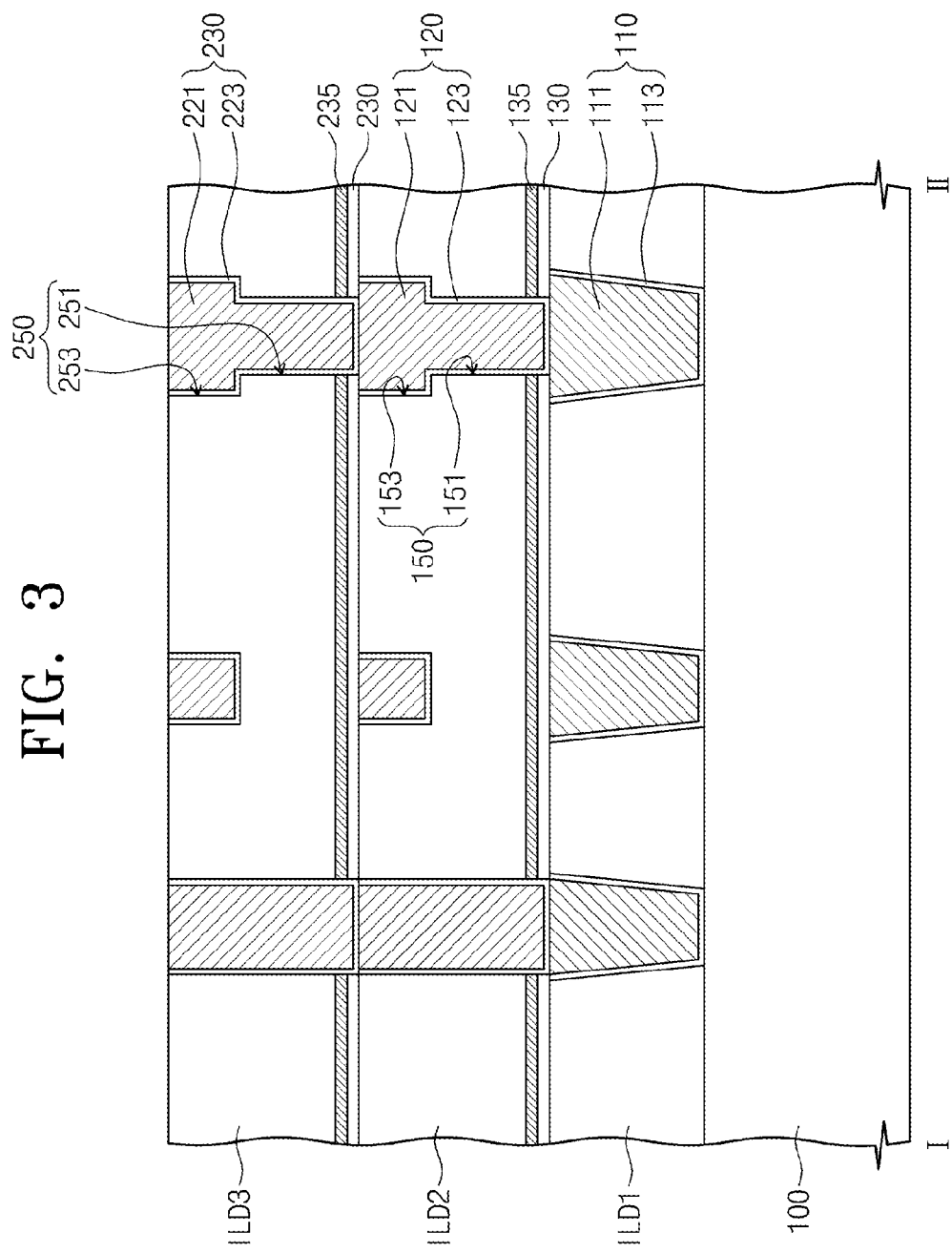
FIG. 3 is a cross-sectional view illustrating a semiconductor device according to example embodiments of the inventive concepts.

FIG. 3 is a cross-sectional view illustrating a semiconductor device according to example embodiments of the inventive concepts. For convenience of explanation, some of descriptions which are substantially the same as descriptions mentioned above referring to FIGS. 2a through 2g will be omitted.

Referring to FIG. 3, a semiconductor device according to example embodiments of the inventive concepts may include first through third interlayer dielectric layers ILD1, ILD2, and ILD3, first through third conductive patterns 110, 120, and 220, and first through fourth etch stop layers 130, 135, 230, and 235. The first interlayer dielectric layer ILD1, the first conductive pattern 110, the second interlayer dielectric layer ILD2, the second conductive pattern 120, the first etch stop layer 130, and the second etch stop layer 135 may be formed using substantially the same manners as the mentioned above referring to FIGS. 2a through 2g.

Additionally, the third interlayer dielectric layer ILD3, the third conductive pattern 220, the third etch stop layer 230, and the fourth etch stop layer 235 may be formed using substantially the same manners of forming the second interlayer dielectric layer ILD2, the second conductive pattern 120, the first etch stop layer 130, and the second etch stop layer 135 which are described above referring to FIGS. 2a through 2g, respectively.

The third etch stop layer 230 may include silicon (Si) and/or carbon (C). However, the third etch stop layer 230 may not include oxygen. For example, the third etch stop layer 230 may include at least one of silicon carbide, silicon nitride, silicon carbon nitride, silicon boron carbide, silicon boron carbon nitride, and any combination thereof. The fourth etch stop layer 235 may be formed on the third etch stop layer 230. The fourth etch stop layer 235 may include aluminum. For example, the fourth etch stop layer 235 may include aluminum nitride or aluminum carbon nitride.

An upper opening 250 may be formed in the third interlayer dielectric layer ILD3. The upper opening 250 may include an upper via hole 251 and an upper trench 253. The upper via hole 251 may be formed at a lower portion of the third interlayer dielectric layer ILD3. The upper trench 253 may be formed at an upper portion of the third interlayer dielectric layer ILD3. The upper trench 253 may be physically connected to the upper via hole. However, it shall not be restricted or limited thereto.

Figure 4:
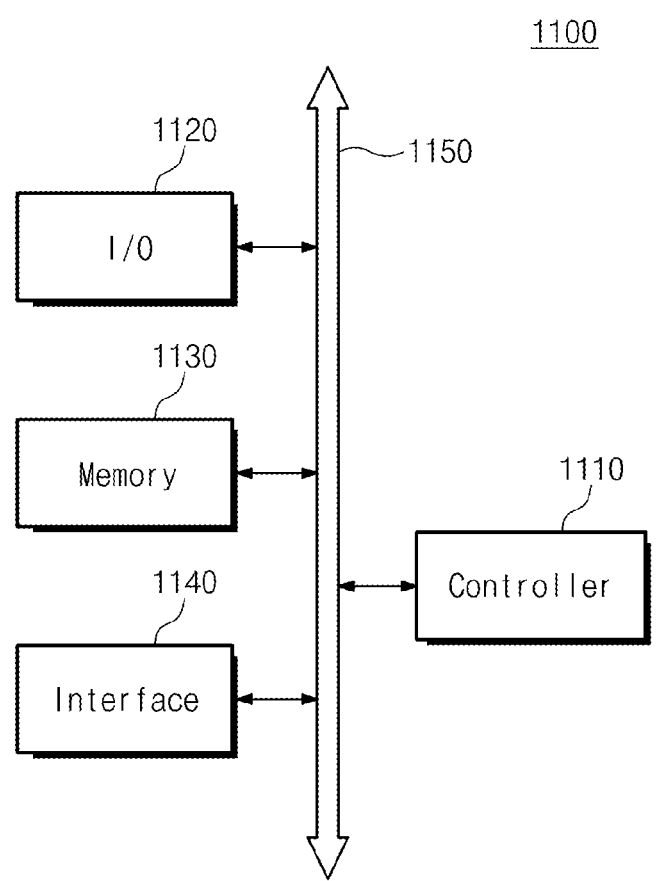
FIG. 4 is a block diagram of a memory system including a semiconductor device according to example embodiments of the inventive concepts.

FIG. 4 is a block diagram of a memory system 1100 including a semiconductor device according to example embodiments of the inventive concepts.

Referring to FIG. 4, the memory system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path that data can be moved to each other.

The controller 1110 may comprise a microprocessor, a digital signal processor, a microcontroller, or a similar device that can control an executive program. The input/output device 1120 may comprise a keypad, a keyboard, or a display. The memory device 1130 may not only save codes or data for executing the controller 1110 but also save data executed by the controller 1110. The memory device 1130 may comprise a semiconductor device according to example embodiments of the inventive concepts.

The memory system 1100 may be applied to a product that can transport information, e.g., a personal digital assistant (PDA), a portable computer, a web tablet, a wireless phone, a mobile phone, a digital music player, or a memory card.

Figure 5:
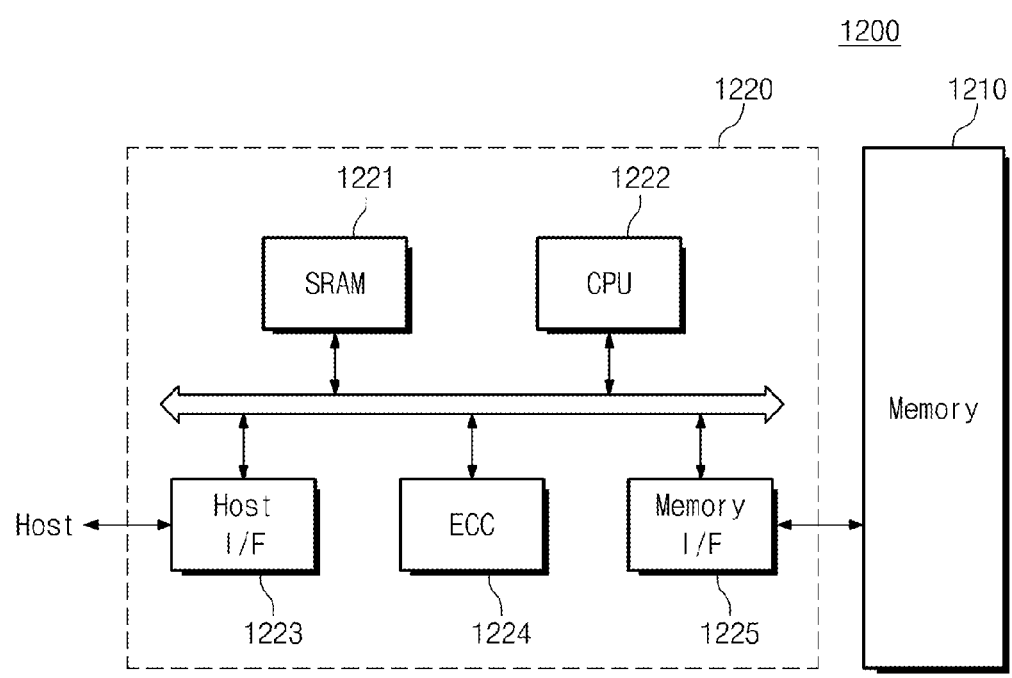
FIG. 5 is a block diagram of a memory card including a semiconductor device according to example embodiments of the inventive concepts.

FIG. 5 is a block diagram of a memory card including a semiconductor device according to example embodiments of the inventive concepts.

Referring to FIG. 5, the memory card 1200 may comprise a memory 1210 having one of the semiconductor devices according to the various example embodiments of the inventive concepts as mentioned above. The memory card 1200 may comprise a memory controller 1220 controlling data exchange between a host 1230 and the memory 1210. The memory controller may comprise a static random access memory (SRAM), a central processing unit (CPU) 1222, a host interface 1223, an error correction code (ECC) 1224, and a memory interface 1225. The SRAM 1221 may be used as a memory device of the CPU 1222. The host interface 1223 may comprise a protocol for exchange data between the host 1230 and the memory card 1200. The ECC 1224 may detect and correct errors in data read out from the memory 1210. The memory interface 1225 may interface with the memory 1210. The CPU 1222 may control overall action relating to data exchange of the memory controller 1220.

Figure 6:
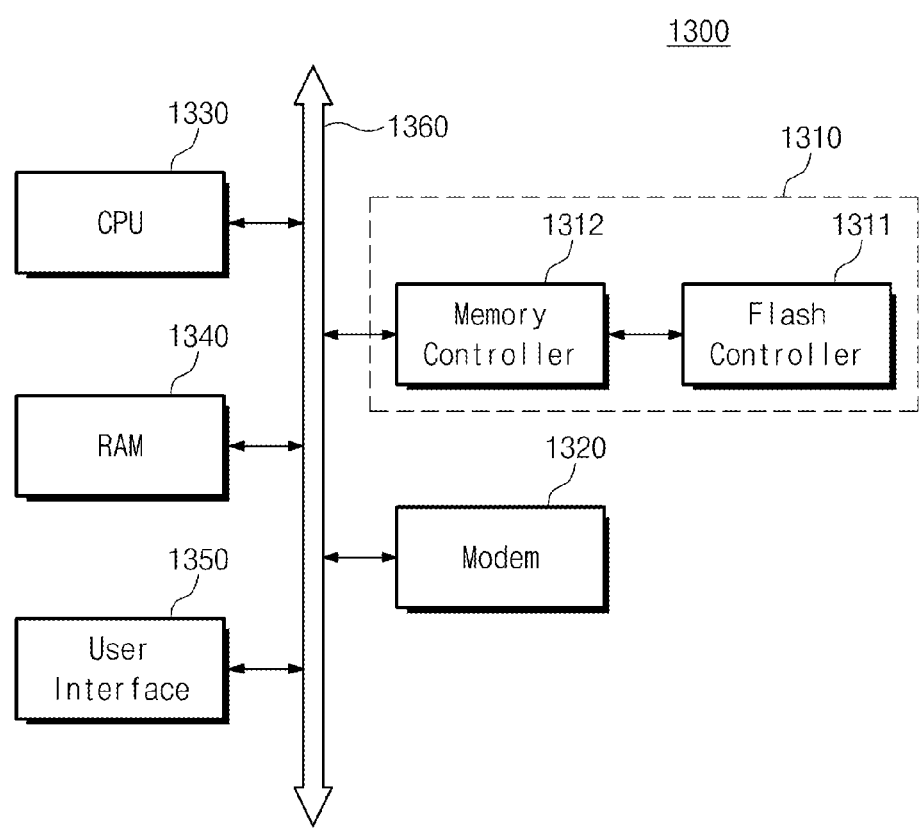
FIG. 6 is a block diagram of an information processing system including a semiconductor device according to example embodiments of the inventive concepts.

FIG. 6 is a block diagram of an information processing system including a semiconductor device according to example embodiments of the inventive concepts.

Referring to FIG. 6, the information processing system 1300 may comprise a memory system 1310 including one of semiconductor devices according to the various example embodiments of the inventive concepts as mentioned above. The memory system 1310 may be connected with a system bus 1360. The information processing system 1300 may further comprise a modem 1320, a central processing unit (CPU) 1330, a random access memory (RAM) 1340, and a user interface 1350 which are connected with the system bus 1360. The memory system 1310 may comprise a flash controller 1311 and a memory controller 1312. The memory controller 1312 may have substantially the same structure as the memory controller 1220 as shown in FIG. 27. A data processed by the CPU 1330 or received from an external device may be stored in the memory system 1310. The information processing system 1300 may be applied to a memory card, a solid state drive (SSD), a camera image sensor, or other various chipsets.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A method of manufacturing a semiconductor device, the method comprising:
    providing a first interlayer dielectric layer having a conductive pattern;
    sequentially forming a first etch stop layer, a second etch stop layer, a second interlayer dielectric layer and a mask pattern on the first interlayer dielectric layer;
    forming an opening in the second interlayer dielectric layer using the mask pattern as a mask, the opening exposing a top surface of the second etch stop layer; and
    performing an etching process in a single etch, the single etch including removing the mask pattern and the second etch stop layer exposed by the opening to expose a top surface of the first etch stop layer.

2. The method of claim 1, wherein the performing does not expose the conductive pattern.

3. The method of claim 1, further comprising:
    exposing the conductive pattern by removing the first etch stop layer exposed by the opening;
    forming a conductive layer in the opening and on the second interlayer dielectric layer; and
    planarizing the conductive layer to expose an upper surface of the second interlayer dielectric layer.

4. The method of claim 3, wherein the removing the mask pattern removes the mask pattern before the forming a conductive layer.

5. The method of claim 3, wherein a portion of the first etch stop layer and a portion of the second etch stop layer remain between the conductive pattern and the second interlayer dielectric layer after the exposing the conductive pattern.

6. The method of claim 1, wherein the sequentially forming forms the first etch stop layer including silicon (Si) and carbon (C).

7. The method of claim 1, wherein the sequentially forming forms the second etch stop layer including an insulating layer containing aluminum (Al).

8. The method of claim 1, wherein the sequentially forming forms the mask pattern including at least one of titanium oxide, titanium nitride, tungsten, and any combination thereof.

9. The method of claim 1, further comprising:
    forming a capping layer between the second interlayer dielectric layer and the mask pattern.

10. A method of manufacturing a semiconductor device, the method comprising:
    providing a first interlayer dielectric layer having a first conductive pattern;
    forming a first etch stop layer on the first conductive pattern and on the first interlayer dielectric layer;
    forming a second etch stop layer on the first etch stop layer;
    forming a second interlayer dielectric layer on the second etch stop layer;
    forming a mask pattern on the second interlayer dielectric layer;
    forming an opening including a via hole and a trench connected to the via hole in the second interlayer dielectric layer to expose the second etch stop layer by etching the second interlayer dielectric layer not covered with the mask pattern,
    wherein the trench has a width greater than that of the via hole; and
    removing the mask pattern to expose a topmost surface of the second interlayer dielectric layer and remove the second etch stop layer,
    wherein the first etch stop layer has a portion overlapped with the via hole in a plan view, and
    wherein the portion of the first etch stop layer is covered by the second etch stop layer after formation of the opening.

11. The method of claim 10, wherein the removing etches the second etch stop layer to expose the first etch stop layer, wherein the first etch stop layer has an etch selectivity with respect to the second etch stop layer during the etching the second etch stop layer.

12. The method of claim 11, further comprising:
    exposing the first conductive pattern by removing the first etch stop layer exposed by the opening;
    forming a conductive layer in the opening and on the second interlayer dielectric layer; and
    planarizing the conductive layer to form a second conductive pattern in the opening.

13. The method of claim 10, wherein
    the forming a first etch stop layer includes forming at least one of silicon carbide, silicon nitride, silicon carbon nitride, silicon boron carbide, silicon boron carbon nitride, and any combination thereof, and
    the forming a second etch stop layer includes forming an insulating layer containing aluminum.

14. The method of claim 10, wherein a sum of thicknesses of the first and second etch stop layers is about 20 angstroms to about 100 angstroms.

15. The method of claim 10, wherein the second interlayer dielectric layer has a dielectric constant less than that of the first etch stop layer and the second etch stop layer.

16. The method of claim 10, wherein the providing the first interlayer dielectric layer includes providing the first conductive pattern including,
   a metal pattern including one of tungsten and copper, and
   a barrier metal pattern on a sidewall and a bottom surface of the metal pattern.

17. A method of manufacturing a semiconductor device, the method comprising:
   forming a first interlayer dielectric layer on a substrate, the first interlayer dielectric layer having a first conductive pattern;
   forming a first etch stop layer on the first conductive pattern and on the first interlayer dielectric layer;
   forming a second etch stop layer on the first etch stop layer;
   forming a second interlayer dielectric layer on the second etch stop layer;
   forming a mask pattern on the second interlayer dielectric layer;
   forming an opening in the second interlayer dielectric layer to expose a top surface of the second etch stop layer by etching the second interlayer dielectric layer not covered with the mask pattern; and
   removing the second etch stop layer exposed by the opening and the mask pattern to expose an upper surface of the first etch stop layer and an upper surface of the second interlayer dielectric layer, respectively,
   wherein the first etch stop layer includes silicon (Si) and carbon (C);
   wherein the second etch stop layer includes an insulating layer containing aluminum (Al);
   wherein the mask pattern includes titanium or tungsten, and
   wherein the first etch stop layer comprises a portion overlapped with the opening in a plan view, wherein the portion of the first etch stop remains on the first conductive pattern during the removing the mask pattern.

18. The method of claim 1, wherein
the mask includes metal.

19. The method of claim 1, the opening includes:
   a via hole having a first width in a lower portion of the second interlayer dielectric layer; and
   a trench having a second width in an upper portion of the second interlayer dielectric layer, the trench connected to the via hole,
   wherein the second width is greater the first width,
   wherein the via hole and the trench are formed before performing the etching process.

20. The method of claim 17, wherein removing the second etch stop layer exposed by the opening and the mask pattern includes simultaneously removing the mask pattern and the second etch stop layer.

* * * * *